United States Patent [19]

Blaum et al.

[11] Patent Number: 5,280,485
[45] Date of Patent: Jan. 18, 1994

[54] CODING METHOD FOR SKEWED TRANSITION DETECTION IN PARALLEL ASYNCHRONOUS COMMUNICATION SYSTEM

[75] Inventors: Miguel M. Blaum, San Jose; Jehoshua Bruck, Palo Alto, both of Calif.

[73] Assignee: International Business Machines Corporation, Armonk, N.Y.

[21] Appl. No.: 715,279

[22] Filed: Jun. 14, 1991

[51] Int. Cl.⁵ .................................. G06F 11/10
[52] U.S. Cl. ........................... 371/1; 371/37.1
[58] Field of Search ...................... 371/1, 37.1

[56] References Cited

U.S. PATENT DOCUMENTS

| | | | |
|---|---|---|---|
| 4,656,634 | 4/1987 | Lombardi et al. | 371/1 |
| 4,691,319 | 9/1987 | Bose et al. | 371/54 |
| 4,908,827 | 3/1990 | Gates | 371/43 |
| 4,980,897 | 12/1990 | Decker et al. | 371/43 |
| 5,208,816 | 5/1993 | Seshardi et al. | 371/43 |

OTHER PUBLICATIONS

T. Verhoeff, Delay-Insensitive Codes—An Overview, Distributed Computing, vol. 3, pp. 1-8, 1988.
Blaum et al., On t-Error Correcting/All Unidirectional Error Detecting Codes, IEEE Transactions on Computers, vol., C38, pp. 1493-1501, Nov. 1989.
Berger, A Note on Error Detection Codes for Asymetric Channels, Information and Control, vol. 4, pp. 68-73, 1961.

Primary Examiner—Charles E. Atkinson
Attorney, Agent, or Firm—Henry E. Otto, Jr.

[57] ABSTRACT

An algorithm for a $(t_1,t_2)$-detecting code, and a method and apparatus for decoding same, for detecting skewed transitions in a parallel asynchronous communication system without acknowledgement. Transitions sent at the same time in a parallel channel may arrive at different times, but the algorithm permits a limited degree of variation in transmission speeds between channels. A desired control operation will be initiated whenever a skewed transition occurs. The code will detect up to $t_1$ or $t_2$ skewed transitions. The values of $t_1$ or $t_2$ for the algorithm are preselected by the user. $t_1$ is the maximum number of transitions that may be missing from a first transmitted codeword when a transition arrives from a second transmitted codeword, and $t_2$ is the maximum number of transitions from the second codeword that may arrive before all transitions of the first codeword arrive.

10 Claims, 4 Drawing Sheets

CODING METHOD FOR SKEWED TRANSITION DETECTION IN PARALLEL ASYNCHRONOUS COMMUNICATION SYSTEM

CROSS REFERENCE TO RELATED APPLICATIONS

[A] U.S. Ser. No. 07/715,524, filed concurrently herewith by Blaum and Bruck, entitled "Method and Apparatus for Encoding and Decoding Unordered Error Correcting Codes"; and

[B] U.S. Ser. No. 07/715,522, filed concurrently herewith by Blaum and Bruck, entitled "Coding Method for Skewed Transition Correction in Parallel Asynchronous Communication Systems".

FIELD OF THE INVENTION

This invention relates to a coding method and apparatus which detects skewed transitions in transmissions in parallel asynchronous communication systems which do not require acknowledgement signals being sent back to the transmitter, and which when no skewed transitions occur, permits continuous pipeline operation.

BACKGROUND OF THE INVENTION

If a communication system which consists of many parallel channels operates asynchronously and without acknowledgement, there is neither a clock signal received by the receiver nor an acknowledgement signal sent back to the transmitter. Each transmission consists of one or more transitions (i.e., "1" bits) which are transmitted at the same time. If the information bits from different channels do not arrive at the same time (e.g., because of a delay in one or more channels), the receiver may receive some "1" bits corresponding to a next transmission before the present transmission has been completed, a condition referred to as "skew".

A paper by T. Verhoeff entitled "Delay-insensitive Codes—An Overview", published in Distributed Computing, Vol. 3, pp. 1-8, 1988, suggests the use in a parallel asynchronous communication system of unordered vectors because they are "delay insensitive". However, the parallel asynchronous communication system he describes requires that an acknowledgement signal be sent by the receiver to the transmitter upon completion of each transmission; and he does not disclose or suggest the use of vectors with Hamming distance properties which are unordered.

To fully understand unordered codes, it is best to consider an example. For a binary vector u of length n, $u = u_1, u_2, \ldots, u_n$. The set of non-zero bits of vector u are hereafter referred to as the "support" of u. For instance, for $n=6$, if $u=100101$, the support of u is the set $\{1,4,6\}$. Two vectors u and v of length n are considered unordered when their supports are unordered as sets; i.e., neither of them contains the other. Thus, $u=100101$ and $v=010101$ are unordered because their corresponding supports are $\{1,4,6\}$ and $\{2,4,6\}$. By contrast, the vector $w=000101$ which has a support of $\{4,6\}$ would not be unordered relative to either u or v because its support $\{4,6\}$ is a subset of the support of both u and v.

There is a need for a parallel asynchronous communication system which (1) does not require acknowledgement between the receiver and transmitter when a transmission is completed; (2) ensures that the receiver can correctly determine when each transmission is completed; (3) distinguishes between signal levels belonging to different transmissions; (4) decodes each transmission to identify when an error-free transmission has arrived; and (5) decodes the transmissions in such a manner as to detect (and, if desired, initiate a preselected control operation) if skew occurs as a result of mixing of transitions in successive transmissions.

SUMMARY OF THE INVENTION

An algorithm for a $(t_1,t_2)$-detecting code, and a method and apparatus for decoding same, are described for detecting skewed transitions in a parallel asynchronous communication system without acknowledgement. Transitions sent at the same time in a parallel channel may arrive at different times, but the algorithm permits a limited degree of variation in transmission speeds between channels.

A desired control operation will be initiated whenever a skewed transition occurs. The code will detect up to $t_1$ or $t_2$ skewed transitions. The values of $t_1$ or $t_2$ for the algorithm are preselected by the user. $t_1$ is the maximum number of transitions that may be missing from a first transmitted codeword when a transition arrives from a second transmitted codeword, and $t_2$ is the maximum number of transitions from the second codeword that may arrive before all transitions of the first codeword arrive.

The $(t_1,t_2)$-detecting code is constructed by selecting codewords constituting a set such that at least one of the following conditions occurs for each arbitrary pair of codewords X, Y in the set:

(a) $\min\{N(X,Y), N(Y,X)\} > t+1$, or (b) $\min\{N(X,Y), N(Y,X)\} > 1$ and $\max\{N(X,Y), N(Y,X)\} > T+1$;

where $t = \min(t_1,t_2)$ and $T = \max(t_1,t_2)$.

DESCRIPTION OF THE PREFERRED EMBODIMENT

Figure 1:
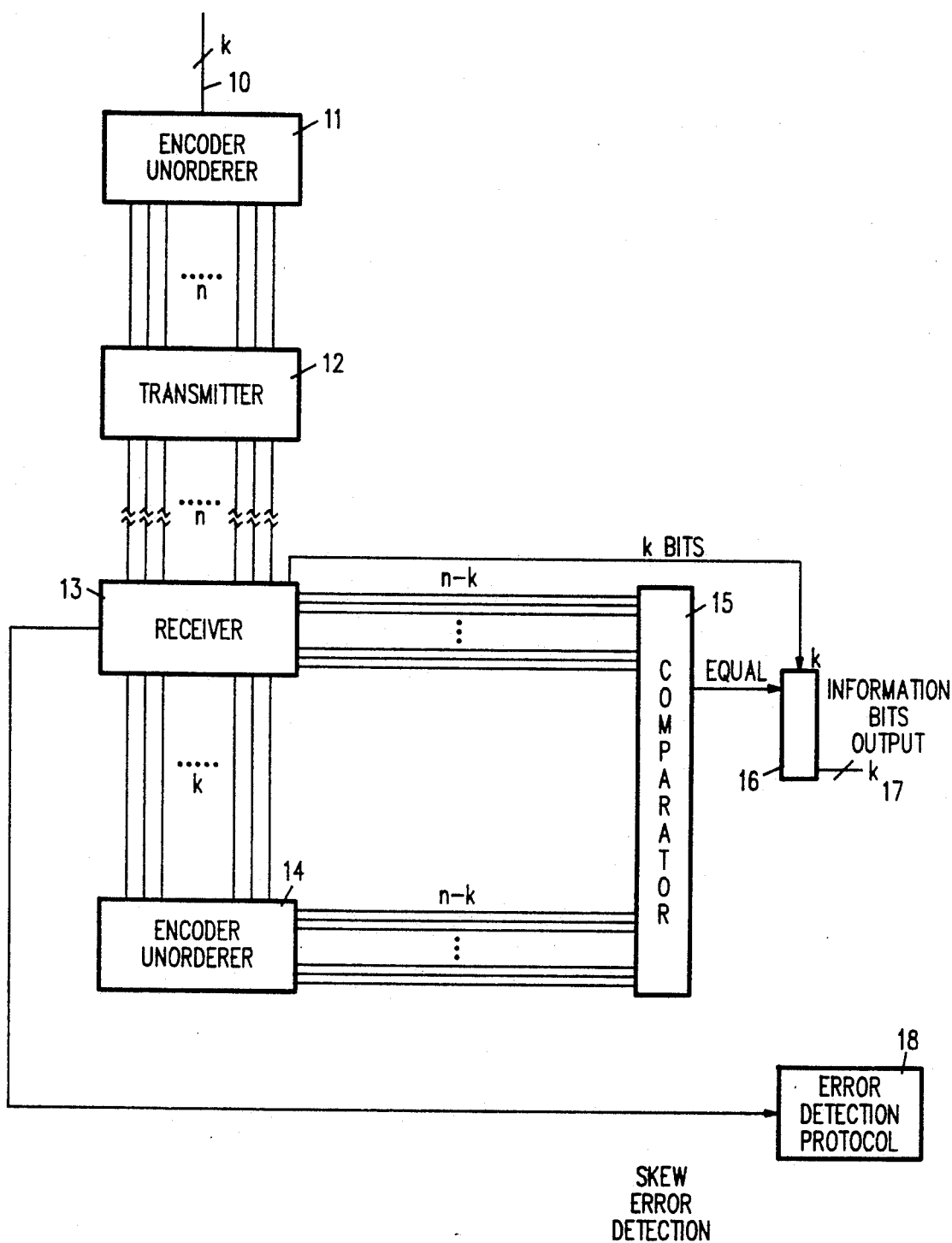
FIG. 1 depicts a parallel asynchronous communication system embodying the present invention.

FIG. 1 depicts a parallel asynchronous communication system for transmitting k information bits and a preselected number of error correcting code (ECC) bits, and a preselected number of "tail" bits. "Tail" bits are redundant bits, preferably minimum in number, which are added to each ECC codeword to ensure that all codewords are rendered unordered.

As shown in FIG. 1, k information bits are transmitted via a bus 10 to an encoder 11 and unordered by adding (n-k) redundancy bits to output an error correcting unordered code of n bits. The n-bit output from encoder 11 is transmitted via n channels to a transmitter 12. Transmitter 12 sends sequences of codewords via n channels to a receiver 13 that, for each received transition, sends the k information bits to an encoder 14 and the (n-k) redundant bits to a comparator 15. Encoder 14 encodes the k bits into an unordered code that performs basically the same redundancy bit encoding operation as encoder 11. Comparator 15 compares the (n-k) bits from receiver 13 with the (n-k) bits from encoder 14. If they are the same, a circuit 16 is operative to output k information bits from receiver 13 to a bus 17. If they are not equal, receiver 13 awaits the arrival of the next transition and repeats the operations above described for each received transition. If receiver 13 detects the arrival of a repeated transition indicative of skew, then an error is indicated and the receiver 13 will deliver a signal to error detection-responsive circuitry 18 to initiate a desired control operation or protocol such as by simply stopping operation, backing up a number of words, or going back to some checkpoint and retransmitting.

Figure 2:
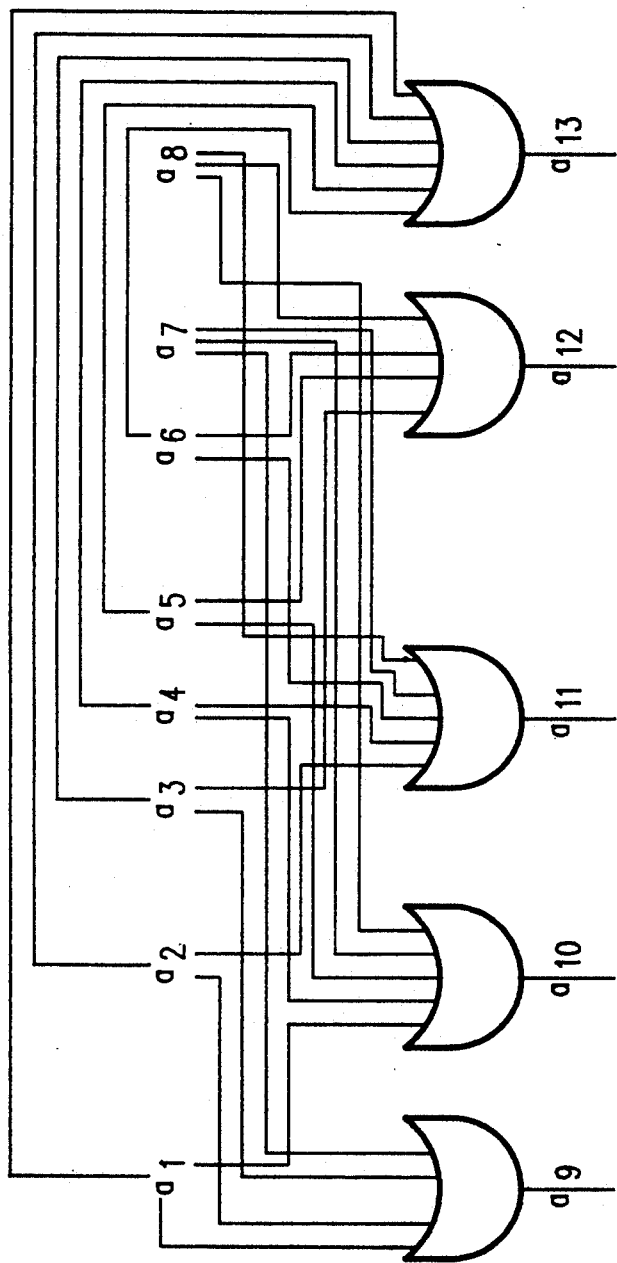
FIG. 2 is a schematic representation of a combinational logic circuit implementation of a portion of an encoder for the preferred embodiment of the invention.

FIG. 2 schematically shows how a combinational logic circuit produces from 8 information bits $a_1$-$a_8$, 5 redundant bits $a_9$-$a_{13}$ corresponding to a (13,8,4) Hamming code.

According to the invention, the following coding technique is presented that (1) does not require acknowledgement of a transmission, thereby enabling efficient asynchronous communication on a pipeline basis, and (2) allows the detection of up to a preselected number of transitions that arrive from a second transmission before reception of the complete first transmission, thereby providing skew detection and accommodating up to a preselected amount of variation in channel transmission speeds.

Assume that a vector X is transmitted followed by a vector Y. (It is not expected that many transitions from Y will arrive before the transmission of X has been completed.) Let $t_1$ represent the maximum number of transitions that may remain in X when a transition from Y arrives. Let $t_2$ represent the maximum number of transitions from Y that may arrive before the completion of X. What is needed is a code that can successfully decode X when no skew has occurred but that can detect skew when it does not exceed the two parameters $t_1$ and $t_2$. Such codes will be called $(t_1,t_2)$- detecting.

A code C is $(t_1,t_2)$-detecting if and only if, for any pair of codewords X,Y $\epsilon$ C (i.e., contained in C), codeword X is transmitted followed by codeword Y, and at least one of the following two conditions is satisfied:

1. $t_1$ is a preselected maximum number of transitions that may be missing from X when a transmission from Y-X arrives (by Y-X is meant the number of transitions in coordinate positions which are in Y but not in X); and 2. $t_2$ is a preselected maximum number of transitions that may arrive from Y-X before all the transitions from X have arrived.

This invention provides a simple criterion that allows the user to decide if a given code is $(t_1,t_2)$-detecting or not. This criterion also allows the user to construct or select efficient $(t_1,t_2)$-detecting codes. Applicants' decoding method allows a receiver to recover a transmission successfully when a $(t_1,t_2)$-detecting code has been used and no skew between transmissions occurs, and detects skew between transmissions when the $(t_1,t_2)$ constraints are not broken.

Given two binary vectors X and Y of length n, let N(X,Y) denote the number of corresponding coordinates in which X is 1 and Y is 0; for example, if X=10110 and Y=00101, and n=5, then N(X,Y)=2 and N(Y,X)=1. Note that N(X,Y)+N(Y,X)=$d_H$(X,Y), where $d_H$ denotes the well-known Hamming distance (which for this example is 3).

The following criterion sets forth the requisite conditions for a code to be $(t_1,t_2)$-detecting:

Assume C is a code and that X and Y are codewords in C. Then C is $(t_1,t_2)$-detecting if and only if at least one of the following two conditions occurs, where $t=\min\{t_1,t_2\}$ and $T=\max\{t_1,t_2\}$:

(a) $\min\{N(X,Y), N(Y,X)\} > t+1$; or (b) $\min\{N(X,Y), N(Y,X)\} > 1$ and $\max\{N(X,Y), N(Y,X)\} > T+1$.

The user can determine if a given code is $(t_1,t_2)$-detecting by checking (a) and (b) over all pairs of codewords. By using global constructions, however, this fact can often be proven without the need of going over all possible pairs.

According to the invention, conditions (a) and (b) above can be used to construct or identify efficient $(t_1,t_2)$-detecting codes. A preferred $(t_1,t_2)$-skew detecting code can be constructed using a standard error correcting code (ECC) of sufficient word length to accommodate the number of information bits to be transmitted and having a minimum distance between each arbitrary pair of codewords of $(t_1+t_2+1)$ using the method (but not the specific code) generically disclosed in the above-identified related application [A].

A $(t_1,t_2)$-detecting code may also be constructed using error correcting/all unidirectional error detecting (EC/AUED) codes, such as disclosed in a paper by Blaum and van Tilborg entitled "On t-Error Correcting/All Unidirectional Error Detecting Codes", published in IEEE Transactions on Computers, Vol. C-38, pp. 1493-1501, November 1989.

Use of an identified or constructed $(t_1,t_2)$-detecting code will permit detection of a codeword in the asynchronous communication system upon completion of a transmission and will detect the occurrence of a skewed transition in a sequence of transmissions as long as $t_1$ or $t_2$ are not exceeded.

Encoding

Any conventional coding method and apparatus may be used to encode the codewords, provided the codewords satisfy the conditions of (a) and/or (b) above.. Since the encoding technique forms no part of the present invention, it will not be described in detail. However, a preferred encoding method and apparatus is that disclosed in the above-identified related application [A].

Decoding

Before describing applicants' decoding method, it is necessary to explain the system of notation that will hereinafter be used.

A plurality of n channels can be represented by the numbers 1,2, ..., n. When a message transmission begins, the signal levels in each of the n channels are subject to individual time delays. After the m-th transition has arrived, the receiver status is represented by the sequence $X_m = x_1, x_2, \ldots, x_m$ where $1 < x_i < n$, the number $x_i$ meaning that the i-th transition was received at the $x_i$-th track. The set $(x_1, x_2, \ldots, x_m)$ will be designated as the "support" (i.e., the set of non-zero coordinates) of a vector that determines uniquely a binary vector. From now on, the sequence $X_m = x_1, x_2, \ldots, x_m$ will denote either the sequence as defined above, or a binary vector as defined by its support. Also, X may denote either a vector or its support; for example, if there are six tracks, labeled as 1,2,3,4,5,6 and the initial condition is presumed to be all zeros (i.e., no transitions received), the chronological representation of the six channels in arbitrary time units is as follows:

|  | 1 2 3 4 5 6 |
|---|---|
| INITIAL STATE | 0 0 0 0 0 0 |
|  | 0 = no one level received; initial condition |
| time 1 | 0 0 0 0 1 0 |
|  | vector $X_1 = (5)$ |
| time 2 | 1 0 0 0 1 0 |
|  | vector $X_2 = (5,1)$ |
| time 3 | 1 1 0 0 1 0 |
|  | vector $X_3 = (5,1,2)$ | and so on.

Figure 3:
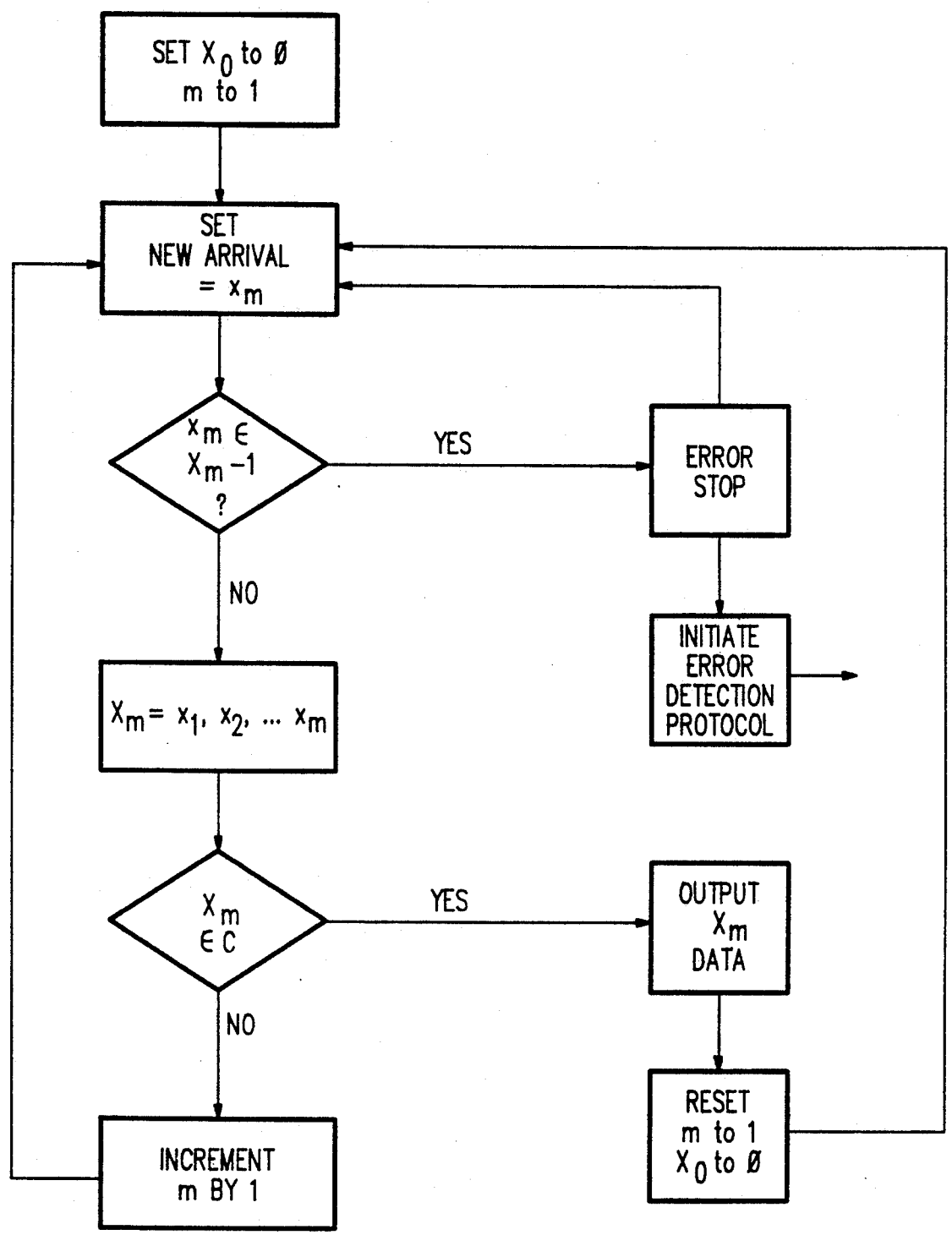
FIG. 3 is a flow chart for a decoding algorithm for implementing the invention.

FIG. 3 is a flow chart setting forth the steps in implementing a decoding algorithm according to the invention and which operates to make a decision upon the arrival of each transition as to whether the received sequence corresponds to a code vector or not. If a received sequence does not correspond to the transmitted vector, the process continues until a transmitted vector is detected which is a member of the code set unless a repeated transition indicates the occurrence of skew. If skew is indicated, a desired control operation is initiated.

The decoding algorithm illustrated in FIG. 3 may be expressed as follows:
Set $m \leftarrow 1$ and $X_0 \leftarrow 0$. Then
(1) Input the new arrival $x_m$.
(2) If $x_m \in X_{m-1}$, then detect a skewed transition and stop; else, let $X_m = x_1, x_2, \ldots, x_m$.
(3) If $X_m \in C$, then output $X_m$, set m equal to 1 and go to step (1); else, increment m by 1 and go to step (1) above.

The exact implementation of the decoding algorithm depends on the specific code used. Normally, the decoder has to check whether a word belongs to the code each time that a transition is received. Hence, basically the same circuit used for encoding can be used for decoding.

EXAMPLE 1

This is a simplified example illustrating how the decoding algorithm operates. Assume that C is a code whose only codewords are X=0111 and Y=1100, resulting in four parallel asynchronous channels. According to conditions (a) and/or (b), code C is (1,1)-detecting.

Assume now that transmitter 12 (FIG. 1) sends the sequence:

2, 3, 4, 2, 3, 4, 1, 2 but that receiver 13 receives the sequence:

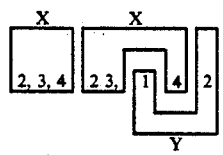

Step 1: Sequence (2) corresponds to vector 0100, which is not in C.
Step 2: Sequence (2,3) corresponds to vector 0110, which is not in C.
Step 3: Sequence (2,3,4) corresponds to vector 0111, which is in C. This corresponds to arrival detection which means that skew-free information has been successfully transmitted.

Thus, the arrival of codeword X has been detected and its information can be utilized by the receiving circuitry.

Step 4: Sequence (2,3,4,2) would ordinarily constitute the detection of a skewed transition because of the repeat of 2 in the sequence; but in Step 3, the arrival of the X codeword was detected and thus the sequence is initialized. The vector now becomes 0100, which is not in C.
Step 5: (2,3) corresponds to a vector 0110, which is not in C.
Step 6: (2,3,1) corresponds to a vector 1110, which is not in C.
Step 7: (2,3,1,4) corresponds to a vector 1111, which is not in C.
Step 8: (2,3,1,4,2) Skew has been detected.

The receiver may report this event to the sender by means of an interrupt to halt the transmission operation and retransmit information. This signal is not an acknowledgement but rather a skew detection interrupt. It is produced only when skew is detected, not when a confirmed codeword has been successfully received. In this very limited example, it is apparent that in Step 6 a transmission from the Y codeword arrived before completion of the reception of the second X codeword.

EXAMPLE 2

This example describes in more detail the encoding decoding of a $(t_1,t_2)$-detecting code for parallel asynchronous communications with skew detection. Assume eight parallel communication lines capable of transmitting $2^8$ or 256 combinations of binary digits, each of word length 8. Obviously, more information will have to be transmitted (in the form of redundancy) to ensure codeword arrival detection without acknowledgement and for skew detection.

In accordance with the present invention, (a) the vector set must be modified by providing a minimum distance of $t_1+t_2+1$ between vectors, and then (b) the vectors must be made unordered so that one vector cannot be contained in another. To produce a (1,2)-detecting code, a minimum distance of four between vectors is required. This can be achieved by concatenating five additional bits to each original eight-bit words using the following algorithm.

For eight information bits, the following is the ordinary structure of the binary word in sequence from least significant bit to most significant bits:

| $a_1$ $a_2$ $a_3$ $a_4$ $a_5$ $a_6$ $a_7$ $a_8$ |
|---|
| (LSB)                                  (MSB) |

While a number of error correcting codes may be used, the additional five redundancy bits to be concatenated to each of the 256 eight-bit information words are determined using a standard (13,8) Hamming code formulation as follows:

$a_9 = a_1 \oplus a_2 \oplus a_3 \oplus a_7;$ $a_{10} = a_1 \oplus a_4 \oplus a_5 \oplus a_7 \oplus a_8;$ $a_{11} = a_2 \oplus a_4 \oplus a_6 \oplus a_7 \oplus a_8;$ $a_{12} = a_3 \oplus a_5 \oplus a_6 \oplus a_8;$ and $a_{13} = a_1 \oplus a_2 \oplus a_3 \oplus a_4 \oplus a_5 \oplus a_6,$ where $\oplus$ is the exclusive OR operator.

To compute the functions for the bits $a_9-a_{13}$, the encoder combinational logic circuit of FIG. 2 is used. Each new codeword now contains the original eight information bits and consists of 13 total bits, and each pair of codewords is at a Hamming distance of at least 4.

The (13,8) Hamming code, while interesting, cannot achieve the goals of parallel asynchronous communication skew detection without acknowledgment. The Hamming codes used in a parallel communication arrangement are not capable of detecting bit skew.

Figure 4:
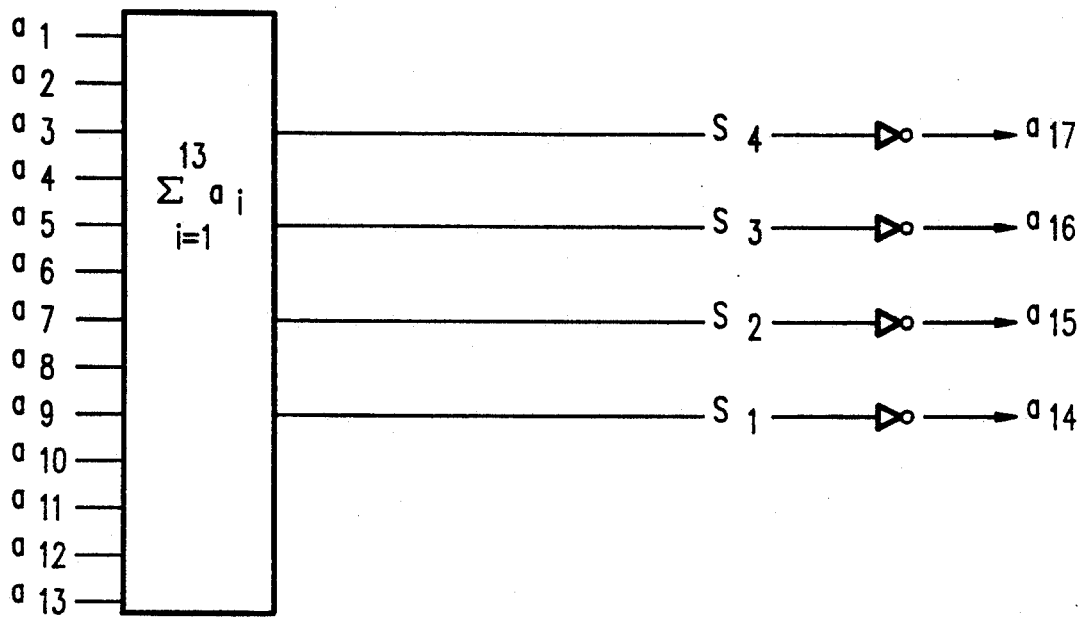
FIG. 4 depicts an encoder logic circuit for one embodiment of the invention.

According to an important feature of the invention, however, applicants have found that by unordering the (13,8) Hamming code codewords or taking a subset of codewords within a code which are unordered, a suitable $(t_1,t_2)$-detecting code can be constructed. Berger, in "A Note on Error Detection Codes for Asymetric Channels", Information and Control, Vol. 4, pp. 68–73, 1961, has shown that the addition of a number of tail bits to fixed-weight codewords can produce unordered codewords. Following Berger's teaching, with codewords having a maximum weight of 13, four additional tail bits may be concatenated to produce unordered codewords. This will require $13+4=17$ parallel communication channels. The corresponding logic circuit is shown in FIG. 4, wherein the four additional bits are $s_1-s_4$.

Figure 5:
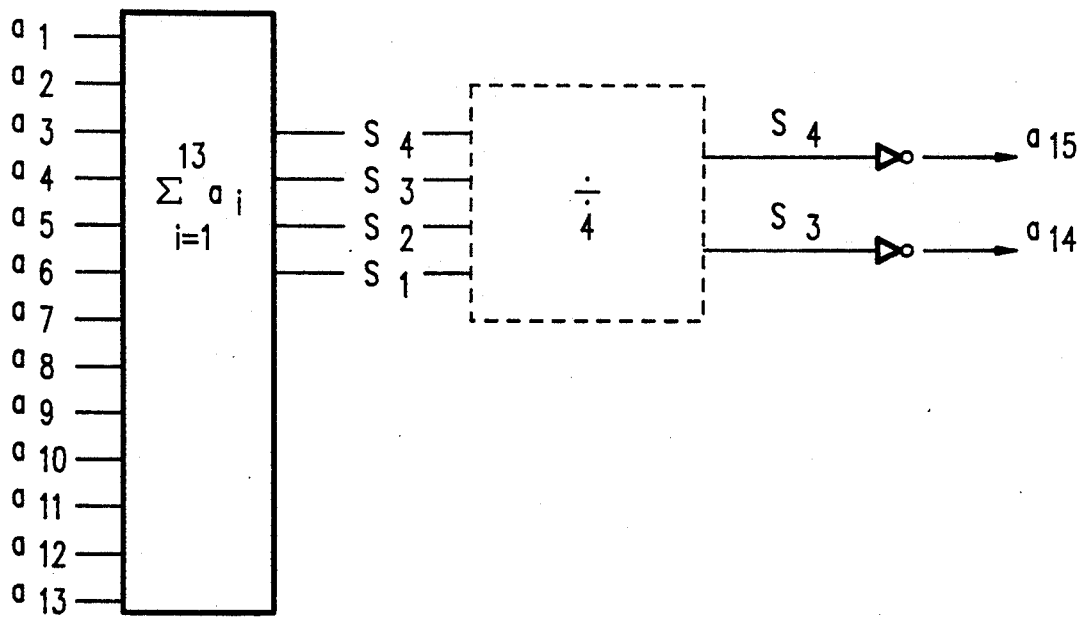
FIG. 5 depicts a modification of the encoder logic circuit of FIG. 4 in accordance with a preferred embodiment of the invention.

Applicants have found, however, that by using the encoder logic circuit implementation illustrated in FIG. 5, only two additional tail bits $s_2,s_4$ (as compared to four when unordering by use of Berger's approach) need be concatenated to the eight information bits plus five redundancy bits which form the minimum distance d of four vector to produce, ultimately, a set of unordered vectors.

This reduction in tail bits is achieved by unordering the vectors by using an unordered error correcting code, such as disclosed in the above-identified related application [A]. This unordering may be achieved by considering a worst case; e.g., a (13,8) Hamming code in which the number of weights is 14. Dividing the weight 14 by the minimum (Hamming) distance 4 gives $$\left\lfloor \frac{14}{4} \right\rfloor = 3, \text{ which written in base 2 is 11,}$$

where [x] denotes the integer part function of x. Finally, taking the complement of the weight and dividing it by 4, produces the additional bits $(a_{14},a_{15})$ which will unorder the set.

Thus, the 256 vectors of total length 15, which contain the original eight information bits, have a minimum distance of four and are unordered, and can be generated easily. The obtained code is (1,2)-detecting or (2,1)-detecting.

EXAMPLE 3

This is an example of implementing applicants' invention in a system with 256 asynchronously transmitted 15-bit vectors in a parallel communication system.

| | Channel Numbers |
|---|---|
| | 1 2 3 4 5 6 7 8 9 10 11 12 13 14 15 |
| X = | 1 0 1 1 0 1 1 0 1  1  1  0  0  0  1 |
| Y = | 0 0 1 0 1 0 1 0 0  0  1  0  0  1  0 |

In other words, $X = \{1,3,4,6,7,9,10,11,15\}$ and $Y = \{3,5,7,11,14\}$.

Assume X is transmitted followed by Y over the 15 parallel lines and the received sequence is:

| X | Y |
|---|---|
| 3, 4, 15, 11, 9, 10, 6, 7, 5, 14, 1, 3, 7, 11 |

Let $x_1-x_{15}$ be the sequence in which the bits of the codeword arrive; that bits $a_1-a_8$ are information bits and bits $a_9-a_{15}$ are redundancy bits; and that $X_1-X_m$ designate the vectors currently stored in a buffer (not shown) following the arrival of each bit sequence $x_1-x_{15}$. Now assume that the initial condition is all 0's; and that each step in the following tabulation represents the arrival of a transition.

|  | 1 2 3 4 5 6 7 8 9 10 11 12 13 14 15 |
|---|---|
| | $x_1$ arrives |
| Step 1: | 0 0 1 0 0 0 0 0 0 0 0 0 0 0 0 |
| | the redundacy bits are now calculated as follows: |
| | $a_9 = a_1 \oplus a_2 \oplus a_3 \oplus a_7 = 1;$ |
| | $a_{10} = a_1 \oplus a_4 \oplus a_5 \oplus a_7 \oplus a_8 = 0;$ |
| | $a_{11} = a_2 \oplus a_4 \oplus a_6 \oplus a_7 \oplus a_8 = 0;$ |
| | $a_{12} = a_3 \oplus a_5 \oplus a_6 \oplus a_8 = 1;$ |
| | $a_{13} = a_1 \oplus a_2 \oplus a_3 \oplus a_4 \oplus a_5 \oplus a_6 = 1;$ |
| | $a_{14} = 1;$ and |
| | $a_{15} = 0$ |
| | Is $X_1 \epsilon C$ ?. Decision NO. |
| | $x_2$ arrives |
| Step 2: | 0 0 1 1 0 0 0 0 0 0 0 0 0 0 0 |
| | Since $a_9 = 1; a_{10} = 1; a_{11} = 1; a_{12} = 1; a_{13} = 0;$ |
| | $a_{14} = 1;$ and $a_{15} = 0,$ the descision is NO. |
| | $x_3$ arrives |
| Step 3: | 0 0 1 1 0 0 0 0 0 0 0 0 0 0 1 |
| | Since $a_9 = 1; a_{10} = 1; a_{11} = 1; a_{12} = 1; a_{13} = 0;$ |
| | $a_{14} = 1;$ and $a_{15} = 0,$ the decision is NO. |
| | $x_4$ arrives |
| Step 4: | 0 0 1 1 0 0 0 0 0 1 0 0 0 0 1 |
| | Since $a_9 = 1; a_{10} = 1; a_{11} = 1; a_{12} = 1; a_{13} = 0;$ |
| | $a_{14} = 1;$ and $a_{15} = 0,$ the decision is NO. |
| | $x_5$ arrives |
| Step 5: | 0 0 1 1 0 0 0 0 1 0 1 0 0 0 1 |
| | Since $a_9 = 1; a_{10} = 1; a_{11} = 1; a_{12} = 1; a_{13} = 0;$ |
| | $a_{14} = 1;$ and $a_{15} = 0,$ the decision is NO. |
| | $x_6$ arrives |
| Step 6: | 0 0 1 1 0 0 0 0 1 1 1 0 0 0 1 |
| | Since $a_9 = 1; a_{10} = 1; a_{11} = 1; a_{12} = 1; a_{13} = 0;$ |
| | $a_{14} = 1;$ and $a_{15} = 0,$ the decision is NO. |
| | $x_7$ arrives |
| Step 7: | 0 0 1 1 0 1 0 0 1 1 1 0 0 0 1 |
| | Since $a_9 = 1; a_{10} = 0; a_{11} = 1; a_{12} = 0; a_{13} = 0;$ |
| | $a_{14} = 1;$ and $a_{15} = 0,$ the decision is NO. |
| | $x_8$ arrives |
| Step 8: | 0 0 1 1 0 1 1 0 1 1 1 0 0 0 1 |
| | Since $a_9 = 0; a_{10} = 1; a_{11} = 1; a_{12} = 1; a_{13} = 1;$ |
| | $a_{14} = 0;$ and $a_{15} = 1,$ the decision is NO. |
| | $x_9$ arrives |
| Step 9: | 0 0 1 1 1 1 1 0 1 1 1 0 0 0 1 |
| | Since $a_9 = 0; a_{10} = 0; a_{11} = 0; a_{12} = 0; a_{13} = 0;$ |
| | $a_{14} = 1;$ and $a_{15} = 0,$ the decision is NO. |
| | $x_{10}$ arrives |
| Step 10: | 0 0 1 1 1 1 1 0 1 1 1 0 0 1 1 |
| | Since $a_9 = 0; a_{10} = 0; a_{11} = 0; a_{12} = 0; a_{13} = 0;$ |
| | $a_{14} = 1;$ and $a_{15} = 0,$ the decision is NO. |
| | $x_{11}$ arrives |

-continued

| | 1 2 3 4 5 6 7 8 9 10 11 12 13 14 15 |
|---|---|
| Step 11: | 1 0 1 1 1 1 1 0 1 1 1 0 0 1 1 |
| | Since $a_9 = 0$; $a_{10} = 1$; $a_{11} = 0$; $a_{12} = 0$; $a_{13} = 0$; $a_{14} = 0$; and $a_{15} = 1$, the decision is NO. |
| | $x_{12}$ arrives |
| Step 12: | Repeated arrival of transition in channel 3; skew is detected. |

The second arrival of a transition in the $x_{12}=3$ position demonstrates the occurrence of skew. The code has successfully detected the skew and will initiate the preselected control operation or protocol in response thereto.

Skew error detection cannot simply involve detecting one bit of a second transmitted vector arriving before completion of the first vector, because the arrival of the first transmitted vector has not yet been confirmed. Thus, any skew mixtures of vectors must continue to be analyzed to determine if they are members of the set of vectors in code C. The detection of skew error occurs when an impossible condition is detected which, regardless of the state of completion of the arrival of the first vector, unequivocally indicates a mixing of transitions characterized by the arrival of a second transition in a channel already detected as having a transition prior to the complete arrival of a vector in the code C.

The present application detects the occurrence of one or more skewed transitions not exceeding the preselected values of $t_1$ or $t_2$; whereas the above-identified related application [B] not only detects but also corrects up to a preselected number of skewed transitions.

While the invention has been particularly shown and described with reference to a preferred embodiment thereof, it will be understood by those skilled in the art that various changes in form and details may be made therein without departing from the spirit and scope of the invention. Accordingly, the method and apparatus herein disclosed are to be considered merely as illustrative and the invention is to be limited only as specified in the claims.

We claim:

1. A parallel asynchronous information communication system which transmits information over parallel channels from a transmitter to a receiver, comprising:
    an encoder for transforming binary electrical signals representing information bits into a set of unordered ECC codewords, including additional electrical signals constituting redundancy bits, for transmission over said parallel channels from the transmitter to the receiver; and
    a decoder for transforming the received codewords by removing all signals constituting redundancy bits and, without requiring acknowledgement, detecting the completion of skew-free transitions and the occurrence of any skewed transitions in said electrical signals due to mixing of transitions from codewords transmitted in sequence.

2. The system of claim 1, wherein said codewords constitute a set selected to provide a ($t_1$, $t_2$) skew-detecting code in which:
    $t_1$ is a preselected maximum number of transmissions that may be missing from a first transmitted codeword when a transition from a second transmitted codeword arrives; and
    $t_2$ is a preselected maximum number of transitions from the second transmitted codeword which may arrive before all the transitions of the first transmitted codeword arrive; and at least one of the following conditions occurs for all codewords X, Y in the set:
    (a) $\min\{N(X,Y), N(Y,X)\} \geq t+1$, or
    (b) $\min\{N(X,Y), N(Y,X)\} \geq 1$ and $\max\{N(X,Y), N(Y,X)\} \geq T+1$,
    where $t=\min(t_1,t_2)$ and $T=\max(t_1,t_2)$, and $N(X,Y)=$ the number of coordinates in which X is 1 and Y is 0.

3. The apparatus of claim 1, including electrical circuitry responsive to detection of electrical signals constituting a skewed transition for initiating a desired control operation.

4. In a parallel asynchronous information communication system without requiring acknowledgement, apparatus for converting information bits in the form of binary electrical signals into a set of ECC codewords for a ($t_1$, $t_2$) skew-detecting code capable of detecting the completion of skew-free transitions of the signals of the codewords and the occurrence of skew due to mixing of transitions from codewords transmitted in sequence, comprising:
    an encoder for transforming binary electrical signals constituting information bits into other binary electrical signals constituting ECC codewords by concatenating sufficient binary electrical signals representing redundancy bits so that no resulting codeword can be contained in another codeword in the code, said ECC codewords being of sufficient word length to accommodate the number of information bits to be transmitted and having a minimum distance between all pairs of codewords of $t_1+t_2+1$, where
    $t_1$ is a preselected number of electrical signal transitions still missing from a first transmitted codeword when an electrical signal transition from a next transmitted codeword arrives; and
    $t_2$ is a preselected number of electrical signal transitions from the next transmitted codeword which may arrive before all of the electrical signal transitions of the first transmitted codeword arrive.

5. The apparatus of claim 4, wherein said encoder includes logic circuitry for reducing the required number of redundancy bits, said logic circuitry comprising:
    means for determining the weight of each of the ECC codewords and expressing that weight in a binary representation; and
    means for complementing the binary representation to produce the redundancy bits.

6. The apparatus of claim 4, wherein said encoder includes logic circuitry for reducing the required number of redundancy bits, said logic circuitry comprising:
    means for determining the weight of each of the ECC codewords and dividing said weight by the quantity $t_1+t_2+1$ and generating the integer portion thereof in binary representation; and
    means for complementing said binary representation to produce the redundancy bits.

7. A parallel asynchronous information communication system for transmitting information as sequences of contemporaneous transitions over n parallel channels without requiring acknowledgement, comprising
    an encoder for transforming a series of k transitions constituting information bits into sets of unordered ECC codewords, each consisting of k bits and (n-k) redundancy bits;

a transmitter for transmitting the codewords over the channels;

a receiver for receiving the codewords as transmitted by the channel and separately outputting the k bits and (n-k) bits thereof; and a decoder comprising:
  (i) an encoder for encoding the k bits output by the receiver into another unordered codeword with (n-k) redundancy bits;
  (ii) a comparator for comparing the (n-k) bits from the receiver with the (n-k) bits from the encoder;
  (iii) circuitry responsive to a compare by the comparator to condition the receiver to output the k bits from the receiver as error free;
  (iv) circuitry operative in the absence of a compare by the comparator to cause the receiver, as each successive transition is received, to separately output k bits and (n-k) bits seeking a compare; and
  (v) means responsive to the arrival of a repeated transition indicative of skew to initiate a desired control operation.

8. The system of claim 7, wherein said codewords constitute a set selected to provide a $(t_1, t_2)$ skew-detecting code in which:

$t_1$ is a preselected maximum number of transmissions that may be missing from a first transmitted codeword when a transition from a second transmitted codeword arrives; and $t_2$ is a preselected maximum number of transitions from the second transmitted codeword which may arrive before all the transitions of the first transmitted codeword arrive; and at least one of the following conditions occurs for all codewords X, Y in the set:
  (a) $\min\{N(X,Y), N(Y,X)\} \geq t+1$, or
  (b) $\min\{N(X,Y), N(Y,X)\} \geq 1$ and $\max\{N(X,Y), N(Y,X)\} \geq T+1$, where $t = \min(t_1, t_2)$ and $T = \max(t_1, t_2)$, and $N(X,Y) =$ the number of coordinates in which X is 1 and Y is 0.

9. In a parallel asynchronous information communication system, a method of transmitting information over parallel channels from a transmitter to a receiver, comprising the steps of:

transforming binary electrical signals representing information bits into a set of unordered ECC codewords, including additional electrical signals constituting redundancy bits, for transmission over said parallel channels from the transmitter to the receiver; and transforming the codewords as received from the channels by removing all signals constituting redundancy bits for detecting, without requiring acknowledgement, the completion of skew-free transitions and the occurrence of any skewed transitions in said electrical signals due to mixing of transitions from codewords transmitted in sequence.

10. The method of claim 9, including the step of:

selecting codewords to provide a $(t_1, t_2)$ skew-detecting code where:

$t_1$ is a preselected maximum number of transmissions that may be missing from a first transmitted codeword when a transition from a second transmitted codeword arrives;

$t_2$ is a preselected maximum number of transitions from the second transmitted codeword which may arrive before all the transitions of the first transmitted codeword arrive; and said codewords constituting a set wherein at least one of the following conditions occurs for all codewords X, Y in the set:
  (a) $\min\{N(X,Y), N(Y,X)\} \geq t+1$, or
  (b) $\min\{N(X,Y), N(Y,X)\} \geq 1$ and $\max\{N(X,Y), N(Y,X)\} \geq T+1$, where $t = \min(t_1, t_2)$ and $T = \max(t_1, t_2)$, and $N(X,Y) =$ the number of coordinates in which X is 1 and Y is 0.

* * * * *